(12) United States Patent
Furutani et al.

(10) Patent No.: US 12,721,200 B2
(45) Date of Patent: Aug. 25, 2026

(54) WIRING SUBSTRATE

(71) Applicant: IBIDEN CO., LTD., Ogaki (JP)

(72) Inventors: Toshiki Furutani, Ibi-gun (JP); Masashi Kuwabara, Ibi-gun (JP); Jun Sakai, Ogaki (JP); Takuya Inishi, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 191 days.

(21) Appl. No.: 18/414,955

(22) Filed: Jan. 17, 2024

(65) Prior Publication Data

US 2024/0243049 A1 Jul. 18, 2024

(30) Foreign Application Priority Data

Jan. 18, 2023 (JP) ................................ 2023-006055

(51) Int. Cl.

| | |
|---|---|
| ***H10W 70/68*** | (2026.01) |
| ***H10W 70/05*** | (2026.01) |
| ***H10W 70/685*** | (2026.01) |
| ***H10W 70/69*** | (2026.01) |

(52) U.S. Cl.

CPC ......... *H10W 70/685* (2026.01); *H10W 70/05* (2026.01); *H10W 70/69* (2026.01)

(58) Field of Classification Search

CPC ........... H01L 23/49822; H01L 21/4857; H01L 23/49894; H01L 23/49827; H05K 1/0298; H05K 1/0353; H05K 1/115

USPC .......................................................... 174/253

See application file for complete search history.

(56) References Cited

U.S. PATENT DOCUMENTS

| | | | | |
|---|---|---|---|---|
| 2021/0272898 A1* | 9/2021 | Takagi | .................... | H01L 21/50 |
| 2022/0071016 A1* | 3/2022 | Hwang | .................. | H05K 3/427 |
| 2024/0215157 A1* | 6/2024 | Park | ...................... | H05K 3/425 |

FOREIGN PATENT DOCUMENTS

| | | |
|---|---|---|
| JP | 2015-126103 A | 7/2015 |

* cited by examiner

*Primary Examiner* — Timothy J Thompson
*Assistant Examiner* — Sidi M Maiga
(74) *Attorney, Agent, or Firm* — Finnegan, Henderson, Farabow, Garrett & Dunner, LLP

(57) ABSTRACT

A wiring substrate includes a first build-up part including first insulating layers and conductor layers, a second build-up part laminated to the first part and including second insulating layers and conductor layers, and via conductors including first via conductors in the first insulating layers and second via conductors in the second insulating layers. The first part is positioned closer to first surface side of the substrate than the second part. The first conductor layers include wirings having wiring width and inter-wiring distance that are smaller than wiring width and inter-wiring distance of wirings in the second conductor layers. The first insulating layers include resin and inorganic particles including first particles forming inner wall surfaces in through holes and second particles embedded in the first insulating layers having different shapes from the first particles. Each first conductor layers and via conductors includes a metal film layer and a plating film layer.

20 Claims, 19 Drawing Sheets

WIRING SUBSTRATE

CROSS-REFERENCE TO RELATED APPLICATIONS

The present application is based upon and claims the benefit of priority to Japanese Patent Application No. 2023-006055, filed Jan. 18, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-126103 describes a printed wiring board that includes an insulating layer having a through hole. The entire contents of this publication are incorporated herein by reference.

SUMMARY OF THE INVENTION

According to one aspect of the present invention, a wiring substrate includes a first build-up part including first insulating layers and first conductor layers, a second build-up part laminated to the first build-up part and including second insulating layers and second conductor layers such that the first build-up part is positioned closer to a first surface side of the wiring substrate than the second build-up part, and via conductors including first via conductors formed in the first insulating layers in the first build-up part and second via conductors formed in the second insulating layers in the second build-up part such that the first via conductors are connecting the first conductor layers in the first build-up part and that the second via conductors are connecting the second conductor layers in the second build-up part. The first build-up part is formed such that the first conductor layers include wirings having a wiring width and an inter-wiring distance that are smaller than a wiring width and an inter-wiring distance of wirings in the second conductor layers in the second build-up part respectively, that the first insulating layers include insulating resin and inorganic particles including first inorganic particles forming inner wall surfaces in through holes for the first via conductors and second inorganic particles embedded in the first insulating layers having shapes that are different from shapes of the first inorganic particles, and that each of the first conductor layers and first via conductors includes a metal film layer formed on a surface of a respective one of the first insulating layers and a plating film layer formed on a surface of the metal film layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 3Q illustrates an example of a method for manufacturing a wiring substrate according to an embodiment of the present invention;

FIG. 3S illustrates an example of a method for manufacturing a wiring substrate according to an embodiment of the present invention.

DETAILED DESCRIPTION OF THE EMBODIMENTS

Figure 1:
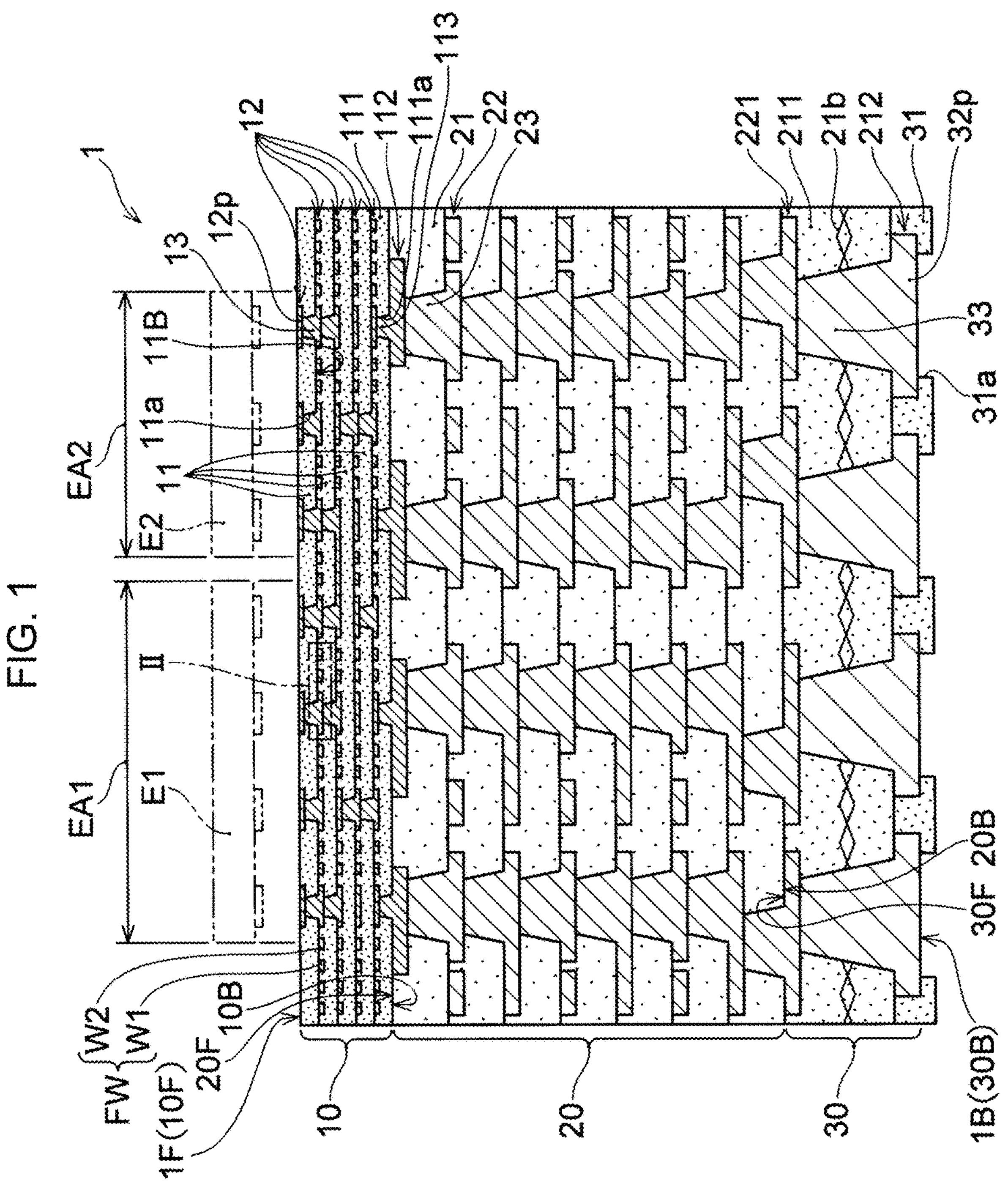
FIG. 1 is a cross-sectional view illustrating an example of a wiring substrate according to an embodiment of the present invention.

Embodiments will now be described with reference to the accompanying drawings, wherein like reference numerals designate corresponding or identical elements throughout the various drawings.

Figure 2:
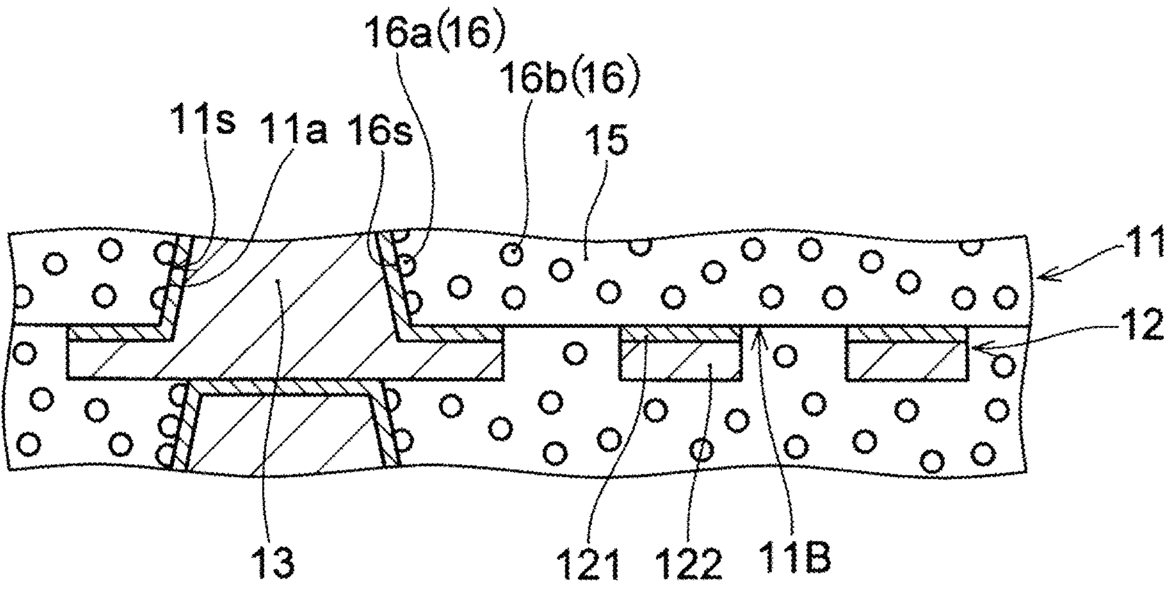
FIG. 2 is an enlarged view of a portion (II) of FIG. 1.

A wiring substrate according to an embodiment of the present invention is described with reference to the drawings. FIG. 1 is a cross-sectional view illustrating a wiring substrate 1, which is an example of a wiring substrate according to an embodiment of the present invention. FIG. 2 illustrates an enlarged view of a portion II) of FIG. 1. A laminated structure, and the number of conductor layers and the number of insulating layers, of the wiring substrate of the present embodiment are not limited to the laminated structure of the wiring substrate 1 of FIG. 1, and the number of conductor layers and the number of insulating layers included in the wiring substrate 1.

The wiring substrate 1 of the embodiment has a laminated structure that includes a first build-up part 10 and a second build-up part 20, which are each formed of alternately laminated multiple conductor layers and multiple insulating layers. The wiring substrate 1 has two surfaces (a first surface (1F) and a second surface (1B) on the opposite side with respect to the first surface (1F)) orthogonal to a thickness direction thereof. As illustrated in FIG. 1, a surface (first surface (10F)) of the first build-up part 10 forms the first surface (1F). As illustrated in FIG. 1, the wiring substrate 1 may further include a third build-up part 30, which is formed of an insulating layer and a conductor layer laminated thereon, on a side opposite to the first build-up part 10 side of the second build-up part 20. When the wiring substrate 1 includes the third build-up part 30, the second surface (1B) can be formed by a surface (second surface (30B)) of the third build-up part 30. However, it is also possible that the third build-up part 30 is not formed. In this case, the second surface (1B) can be formed by a surface (second surface (20B)) of the second build-up part 20. The wiring substrate 1 of the present embodiment is preferably a coreless wiring substrate that does not include a core layer.

The first build-up part 10 includes relatively fine wirings and may have relatively dense circuit wirings. In the example of FIG. 1, the first build-up part 10 includes alternately laminated insulating layers 11 (first insulating layers 11) and conductor layers 12 (first conductor layers 12). Conductor layers 12 facing each other with one insulating layer 11 in between are connected by via conductors 13 (first via conductors 13). The first build-up part 10 of FIG. 1 further includes an insulating layer 111 formed closest to the second build-up part 20 side. The conductor layers 12 are each patterned to have predetermined conductor patterns. As illustrated in FIG. 1, the first build-up part 10 of the present embodiment does not include a core layer. The first surface (10F) of the first build-up part 10 is formed of a surface (upper surface) of a conductor layer 12 and a surface (upper surface) of an insulating layer 11 exposed from the patterns of the conductor layer 12. In the illustrated example, the conductor layer 12 forming the first surface (10F) is formed to have patterns including multiple conductor pads (12*p*).

In the description of the wiring substrate 1 of the present embodiment illustrated in FIG. 1, the first surface (10F) side of the first build-up part 10, that is, the first surface (1F) side of the wiring substrate 1 is referred to as "upper" or an "upper side," and the second surface (1B) side of the wiring substrate 1 is referred to as "lower" or a "lower side." Further, for each of the structural elements, a surface facing the first surface (1F) side of the wiring substrate 1 is also referred to as an "upper surface," and a surface facing the second surface (1B) side of the wiring substrate 1 is also referred to as a "lower surface."

The conductor pads (12*p*) form a component mounting surface of the wiring substrate 1, which is an uppermost surface of the first build-up part 10, that is, an outermost surface of the wiring substrate 1, and on which external electronic components can be mounted. The component mounting surface of the wiring substrate 1 may have multiple component mounting regions. For example, as illustrated in the example of FIG. 1, two component mounting regions (EA1, EA2) may be formed corresponding to regions where electronic components (E1, E2) are to be mounted.

In mounting the electronic components (E1, E2) to the wiring substrate 1 in the illustrated example, upper surfaces of the conductor pads (12*p*) can be electrically and mechanically connected to the electronic components (E1, E2), for example, via a conductive bonding material such as solder (not illustrated in the drawings). In this case, for example, a plating layer (not illustrated in the drawings) including a nickel layer and a tin layer may be formed in advance on the upper surfaces of the conductor pads (12*p*).

Examples of the electronic components (E1, E2) that can be mounted on the wiring substrate 1 include electronic components such as active components such as semiconductor integrated circuit devices and transistors. Specifically, for example, the electronic components can each be an integrated circuit such as a logic chip incorporating a logic circuit, a processing unit such as an MPU (Micro Processor Unit), or a memory element such as an HBM (High Bandwidth Memory).

In the example of FIG. 1, a second surface (10B) of the first build-up part 10 on the opposite side with respect to the first surface (10F) is formed by a surface (lower surface) of the insulating layer 111. The first build-up part 10 is laminated such that the second surface (10B) thereof faces a first surface (20F) of the second build-up part 20 on the opposite side with respect to the second surface (20B).

Examples of a conductor forming the conductor layers 12 and the via conductors 13 include copper, nickel, and the like, and copper is preferably used. In FIG. 1, the conductor layers 12 and the via conductors 13 are each illustrated as having a single-layer structure. However, the conductor layers 12 and the via conductors 13 can each have a multilayer structure. For example, in the wiring substrate 1 of the present embodiment, the conductor layers 12 and the via conductors 13 can each have a multilayer structure including, for example, a metal film layer, which is an electroless plating film or a sputtering film, and an electrolytic plating film layer. Further, as illustrated in FIG. 2, the conductor layers 12 and the via conductors 13 may each have a two-layer structure including a metal film layer (preferably, a sputtering film layer) 121 and a plating film layer (preferably, an electrolytic plating film layer) 122. That is, each conductor layer 12 can include a first layer 121 (that is, an upper layer of the conductor layer 12) formed on a lower surface of an insulating layer 11 and a second layer 122 (that is, a lower layer of the conductor layer 12) formed on a surface of the first layer 121 on the opposite side with respect to the insulating layer 11 side.

The conductor layers 12 of the wiring substrate 1 can have fine wirings (FW), which are high-density wirings with relatively small pattern widths and inter-pattern distances. The fine wirings (FW) can have smallest pattern widths and inter-pattern distances among wirings of the wiring substrate 1. The fine wirings (FW) include, for example, a first signal wiring (W1) and a second signal wiring (W2). The first signal wiring (W1) and the second signal wiring (W2) may be arranged in parallel at a predetermined distance, and a pair of these wirings may form a pair wiring that propagates one signal. For example, as a pair wiring, a differential wiring suitable for transmitting a differential signal can be exemplified.

In the illustrated example, among the multiple conductor layers 12 included in the first build-up part 10, four conductor layers 12 have fine wirings (FW), which are high-density wirings. However, it is also possible that fewer conductor layers 12 have fine wirings (FW). The number of the conductor layers 12 having fine wirings (FW) in the first build-up part 10 is not limited.

The fine wirings (FW) included in the first build-up part 10 have smaller pattern widths and inter-pattern distances than pattern widths and inter-pattern distances of wirings included in conductor layers 22 (second conductor layers 22) in the second build-up part 20 to be described later. Specifically, for example, the fine wirings (FW) have a minimum wiring width of about 3 μm or less and minimum inter-wiring distance of about 3 μm or less. Since the first build-up part 10 has the fine wirings (FW), it may be possible to provide wirings with more appropriate characteristics for electrical signals that can be transmitted via the wirings in the first build-up part 10. Further, it is thought that it may be possible to increase a density of the wirings in the first build-up part 10 and to improve a degree of freedom in wiring design. From the same point of view, an aspect ratio of each wiring of the conductor layers 12 having the fine wirings (FW) is, for example, 2.0 or more and 4.0 or less.

The conductor layers 12 each have a thickness of about 7 μm or less. When the conductor layers 12 include the fine wirings (FW), the metal film layer 121 (see FIG. 3M) of the two-layer structure of the conductor layers 12 and the via conductors 13 can preferably be a sputtering film layer formed by sputtering.

The via conductors 13 connecting conductor layers 12 facing each other with an insulating layer 11 in between are formed by filling through holes (11*a*) penetrating the insulating layer 11 with conductors. In the example of FIG. 1, each via conductor 13 is integrally formed with a conductor layer 12 provided on a lower side thereof. Therefore, the via conductor 13 and the conductor layer 12 can be formed by the same metal film layer 121 and plating film layer 122. The conductor layers 12 are respectively formed on lower surfaces (11B) of the insulating layers 11. That is, each insulating layer 11 covers the lower surface (11B) of an upper insulating layer 11 that is not covered by a conductor layer 12, and covers the lower surface of the upper conductor layer 12 and side surfaces of the conductor patterns included in the upper conductor layer 12.

In the first build-up part 10 including the conductor layers 12 including the fine wirings (FW), the insulating layers 11 each have a thickness of, for example, about 7.5-10 μm. Preferably, the insulating layers 11 do not each contain a core material (reinforcing material) formed of a glass fiber, an aramid fiber, or the like.

The insulating layers 11 of the first build-up part 10 each include, for example, an insulating resin 15 (see FIG. 2) such as an epoxy resin or a phenol resin, and, although not illustrated in FIG. 1, a large number of inorganic particles 16 (see FIG. 2) dispersed in the insulating resin 15. Examples of the inorganic particles 16 include fine particles formed of silica ($SiO_2$), alumina, mullite, or the like.

FIG. 2 is an enlarged view of an insulating layer 11, a conductor layer 12, and a via conductor 13 in the wiring substrate 1 illustrated in FIG. 1. As illustrated in FIG. 2, the surface (lower surface) (11B) of the insulating layer 11 on the side covered by the conductor layer 12 is formed only of the insulating resin 15. That is, the inorganic particles 16 are not exposed from the lower surface (11B) of the insulating layer 11. The lower surface (11B) of the insulating layer 11 does not contain the inorganic particles 16. In the present embodiment, the lower surface (11B) of the insulating layer 11 is formed smooth.

On the other hand, as illustrated in FIG. 2, on an inner wall surface (11*s*) of a through hole (11*a*) for forming a via conductor 13, cross sections of the inorganic particles 16 (first inorganic particles (16*a*)) are exposed. That is, the inorganic particles 16 include first inorganic particles (16*a*) forming the inner wall surface (11*s*) of the through hole (11*a*) and second inorganic particles (16*b*) embedded in the insulating layer 11. The second inorganic particles (16*b*) each have a substantially spherical shape. The first inorganic particles (16*a*) each have a shape obtained by cutting such a substantially spherical shape along a plane, that is, a spherical segment shape. That is, the first inorganic particles (16*a*) are inorganic particles 16 that have divided shapes of the second inorganic particles (16*b*), which are obtained by cutting the second inorganic particles (16*b*) along a plane. The first inorganic particles (16*a*) and the second inorganic particles (16*b*) are different in shape.

The inner wall surface (11*s*) of the through hole (11*a*) is formed of the first inorganic particles (16*a*) and the insulating resin 15. The cross sections of the first inorganic particles (16*a*), that is, flat parts (16*s*) of the first inorganic particles (16*a*) that are formed by cutting the second inorganic particles (16*b*) along a plane, form the inner wall surface (11*s*) of the through hole (11*a*). The inner wall surface (11*s*) is formed of the insulating resin 15 and the flat parts (16*s*). The flat parts (16*s*) and a surface of the insulating resin 15 forming the inner wall surface (11*s*) form a substantially common surface.

No unevenness is formed on the insulating resin 15 that forms the inner wall surface (11*s*). The surface of the insulating resin 15 that forms the inner wall surface (11*s*) is smooth. Also no unevenness is formed on exposed surfaces of the flat parts (16*s*) that form the inner wall surface (11*s*). The exposed surfaces of the flat parts (16*s*) are smooth. The inner wall surface (11*s*) of the through hole (11*a*) has an arithmetic mean roughness (Ra) of about 1.0 μm or less.

The through holes (11*a*) can be formed at positions in the insulating layers 11 where the via conductors 13 are to be formed, for example, by irradiating laser from the lower surface (11B) side of each of the insulating layers 11. A diameter of each of the through holes (11*a*) is larger on a laser irradiation side and becomes smaller on the opposite side (deep side) with respect to the laser irradiation side. Therefore, the through holes (11*a*) can be formed such that a diameter (width) on the lower side is large and a diameter (width) on the upper side is small. As illustrated in FIG. 1, the via conductors 13 included in the first build-up part 10 are formed to each have a tapered shape that is reduced in diameter from the second surface (10B) toward the first surface (10F) of the first build-up part 10. Here, for convenience, the term "reduced in diameter" is used. However, a shape of each of the via conductors 13 is not necessarily limited to a circular shape. The term "reduced in diameter" means that a longest distance between two points on an outer circumference of a horizontal cross section of each of the via conductors 13 is reduced. For example, the through holes (11*a*) are formed such that an aspect ratio of each via conductor 13 ((height from the upper surface of the lower conductor layer 12 to the lower surface of the upper conductor layer, the lower and upper conductor layers being connected by the via conductor 13)/(diameter of the via conductor 13 at the upper surface of the lower conductor layer 12)) is about 0.5 or more and about 1.0 or less. A via diameter of each via conductor 13 (a diameter of the via conductor 13 at the upper surface of the lower conductor layer 12 to which the via conductor 13 is connected) is about 10 μm.

Figure 3A:
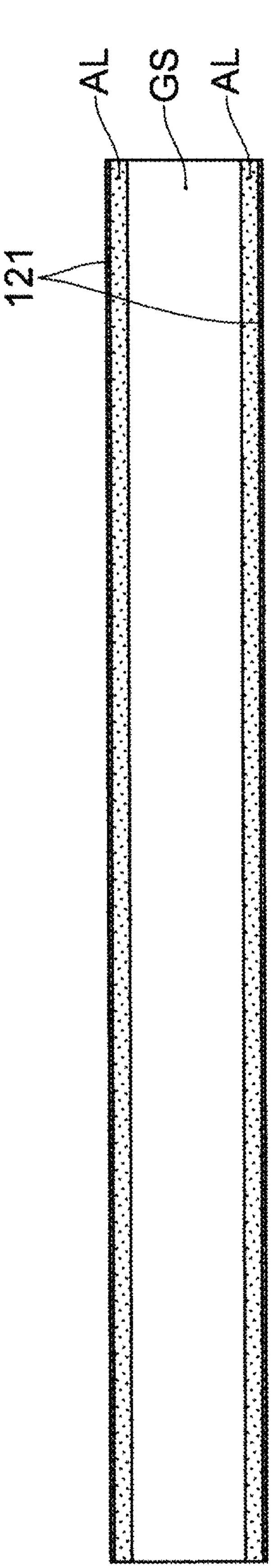
FIG. 3A illustrates an example of a method for manufacturing a wiring substrate according to an embodiment of the present invention.
Figure 3B:
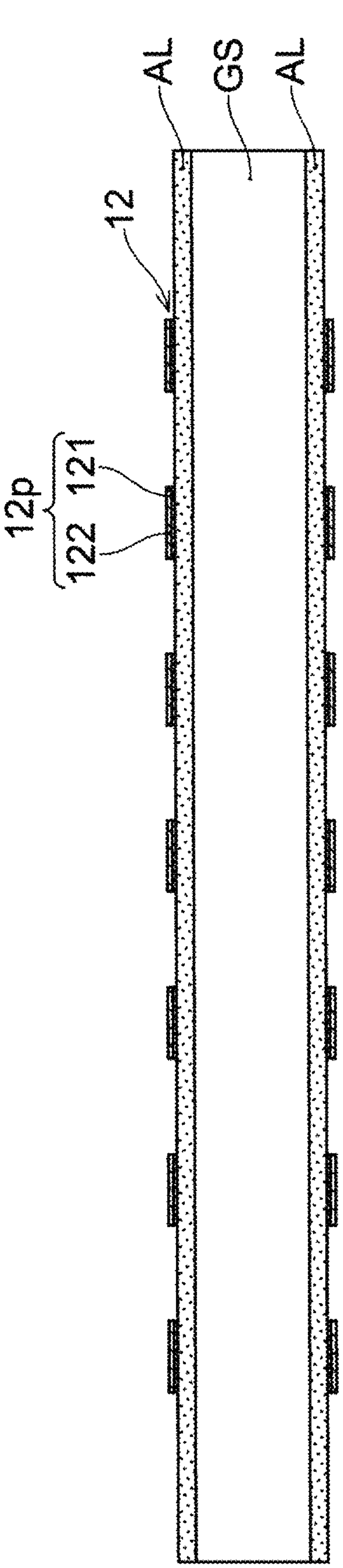
FIG. 3B illustrates an example of a method for manufacturing a wiring substrate according to an embodiment of the present invention.
Figure 3C:
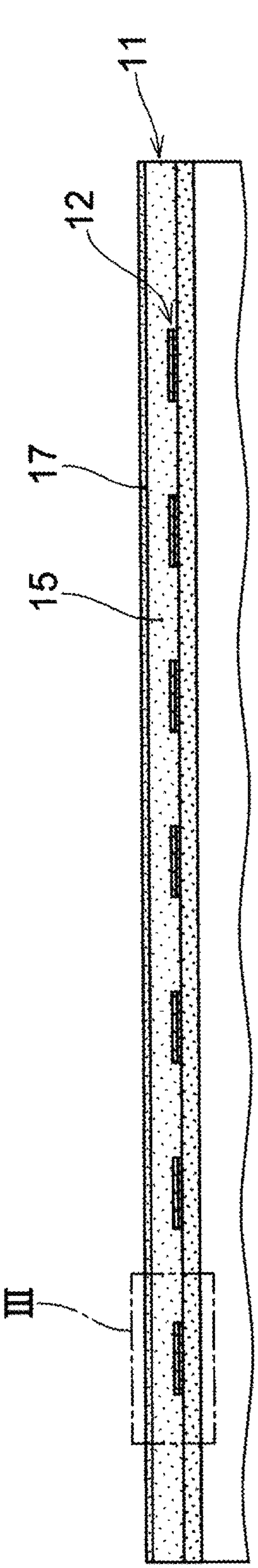
FIG. 3C illustrates an example of a method for manufacturing a wiring substrate according to an embodiment of the present invention.
Figure 3D:
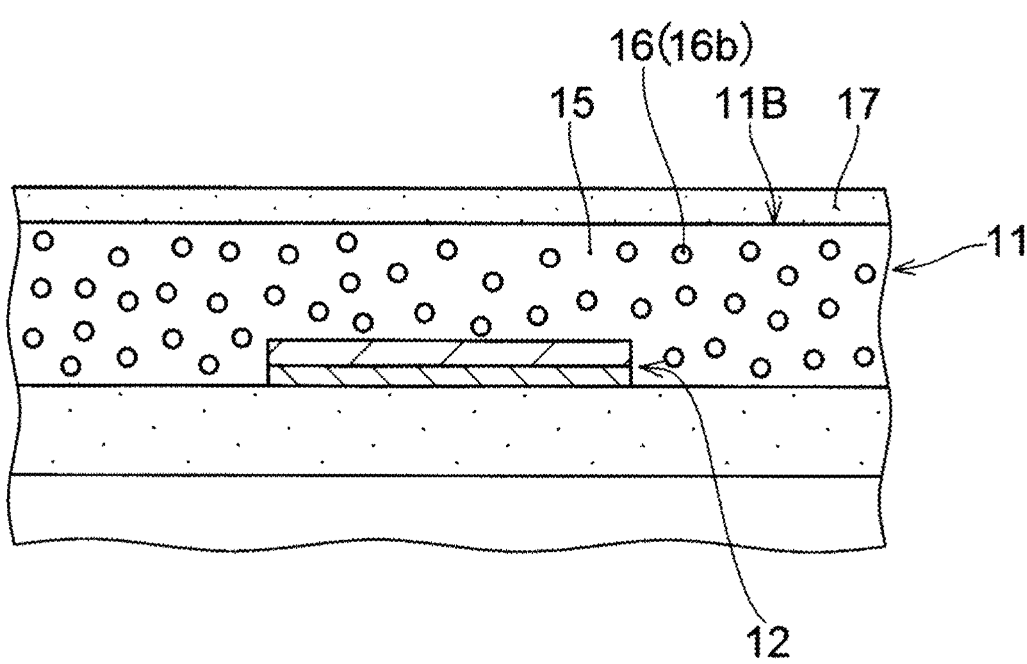
FIG. 3D is an enlarged view illustrating an example of a method for manufacturing a wiring substrate according to an embodiment of the present invention.
Figure 3E:
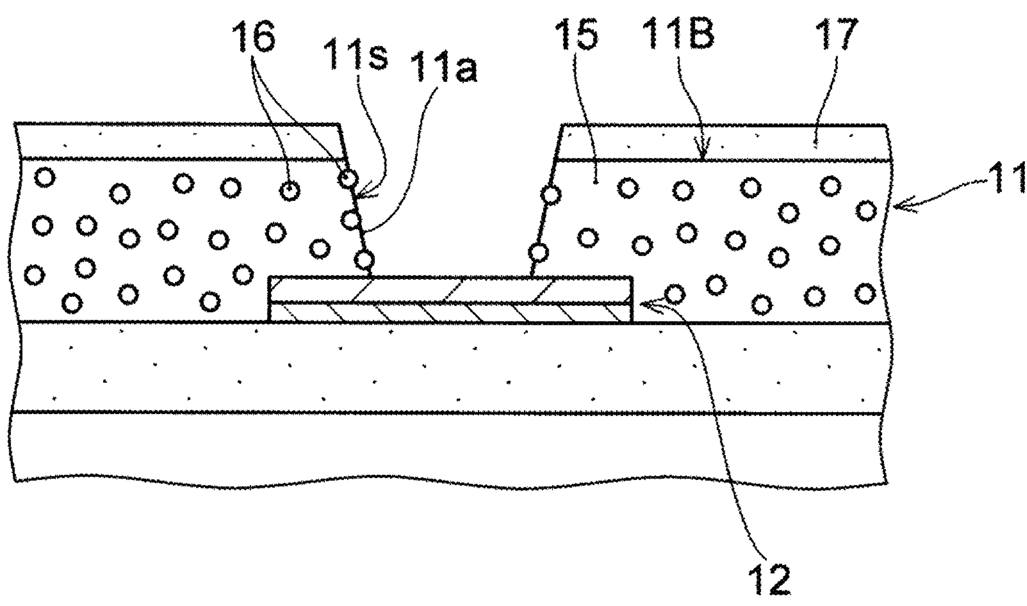
FIG. 3E is an enlarged view illustrating an example of a method for manufacturing a wiring substrate according to an embodiment of the present invention.

In the present embodiment, the formation of the through holes (11*a*) by laser irradiation is performed by irradiating laser while protecting the surface (lower surface (11B)) of the insulating layer 11 by covering the surface with a protective film 17 such as a polyethylene terephthalate (PET) film (see FIGS. 3C-3E). The insulating layer 11 contains the insulating resin 15 and the inorganic particles 16 (second inorganic particles (16*b*)) (see FIG. 3D). The inorganic particles 16 are embedded in the insulating resin 15. Laser irradiated from above the protective film 17 penetrates the protective film 17 and the insulating layer 11 at the same time. After the formation of the through holes (11*a*), a dry desmear treatment using a plasma gas is performed. However, the desmear treatment is also performed while the surface (lower surface (11B)) of the insulating layer 11 is protected with the protective film 17 having been formed (see FIG. 3F). After the desmear treatment, the protective film 17 is removed (see FIG. 3G). Therefore, the surface (lower surface (11B)) of the insulating layer 11 is not roughened. The surface (lower surface (11B)) of the insulating layer 11 is a surface on which the inorganic particles 16 are not exposed.

It is thought that, when the surface (lower surface (11B)) of the insulating layer 11 is a surface formed only of the insulating resin 15 with no exposed inorganic particles 16, the relative permittivity of the surface (lower surface (11B)) of the insulating layer 11 becomes uniform. Therefore, it is thought that a difference in transmission speed between the fine wirings (FW), which are high-density wirings formed on the lower surface of the insulating layer 11, can be reduced.

On the other hand, as illustrated in FIG. 3E, the inner wall surface (11*s*) of each of the through holes (11*a*) after being formed by laser irradiation is formed of the insulating resin 15 and the inorganic particles 16 protruding from the insulating resin 15. That is, the insulating resin 15 is processed by laser irradiation. However, the inorganic particles 16 contained in the insulating resin 15 are not processed. Therefore, portions of the inorganic particles 16 that are embedded in the insulating resin 15 are exposed from the processed surface of the insulating resin 15 into the through holes (11*a*). After the formation of the through holes (11*a*), a dry desmear treatment using plasma is performed as described above. However, by this dry desmear treatment, the protruding portions of the inorganic particles 16 protruding from the insulating resin 15 can be selectively removed (see FIG. 3F). The first inorganic particles (16*a*) having the flat parts (16*s*) are formed. That is, the substantially spherical second inorganic particles (16*b*) are cut along a plane, and the first inorganic particles (16*a*) having divided shapes of the second inorganic particles (16*b*) are formed. The inner wall surface (11*s*) of each of the through holes (11*a*) of the embodiment as illustrated in FIG. 2 is obtained. The inner wall surface (11*s*) is a smooth surface in which the exposed surfaces of the flat parts (16*s*) and the insulating resin 15 are positioned substantially on the same plane. For example, a preferable dry desmear treatment is a dry desmear treatment using a gas containing tetrafluoromethane.

In the present embodiment, as illustrated in FIG. 2, the metal film layer 121 is formed on the inner wall surface (11*s*) of the through hole (11*a*). No inorganic particles 16 are contained in the metal film layer 121. Since the inner wall surface (11*s*) of the through hole (11*a*) is a smooth surface, the metal film layer 121 can cover the inner wall surface (11*s*) with a uniform thickness. In a case where the metal film layer 121 is a sputtering film layer, when the protruding portions of the inorganic particles 16 protruding from the insulating resin 15 are present on the inner wall surface (11*s*), it is thought that there is a risk that growth of the sputtering film may be inhibited by the protruding portions. There is also a risk that the sputtering film is not formed on the surface of the insulating resin 15 between the protruding portions of the inorganic particles 16 and as a result, a continuous sputtering film is not formed. It is thought that, in order to form a continuous sputtering film, it may be necessary to increase a thickness of the sputtering film and it may be difficult to form fine conductor circuits. In the present embodiment, a uniform and continuous thin seed layer (the metal film layer 121) can be formed on the inner wall surface (11*s*) of each of the through holes (11*a*).

As described above, the lower surface (11B) of the insulating layer 11 also does not contain the inorganic particles 16. A metal film layer 121 having a uniform thickness can also be formed on the lower surface (11B) of the insulating layer 11. By forming the plating film layer 122 on the metal film layer 121 using the metal film layer 121 as a seed layer, the conductor layer 12 is formed. And, by forming an electrolytic plating film (122*a*) (see FIG. 3K) on the metal film layer 121 in the through holes (11*a*) so as to fill the through holes (11*a*), the via conductors 13 formed of the metal film layer 121 and the plating film layer 122 are formed.

In the present embodiment, as will be described later, the surface (lower surface) of the conductor layer 12 is also a highly flat polished surface that has been flattened by polishing. Therefore, it is thought that the wiring substrate 1 of the embodiment can provide good high frequency transmission characteristics in the first build-up part 10.

As illustrated in FIG. 1, the insulating layer 111 of the first build-up part 10 includes via conductors 113 formed by filling through holes (111*a*) penetrating the insulating layer 111 with conductors. A conductor layer 112 is formed on the lower surface of the insulating layer 111. The conductor layer 112 is patterned to have predetermined conductor patterns. The via conductors 113 connect the conductor layer 112 and the conductor layer 12 in the first build-up part 10 that faces the conductor layer 112 with the insulating layer 111 in between.

The first build-up part 10 is laminated on the second build-up part 20. That is, the second surface (10B) of the first build-up part 10, which is formed by the lower surface of the insulating layer 111, which is the lowermost layer in the first build-up part 10, faces the first surface (20F) of the second build-up part 20.

Similar to the first build-up part 10, the second build-up part 20 includes alternately laminated insulating layers 21 and conductor layers 22 (second conductor layers). In each of the insulating layers 21, via conductors 23 that penetrate the each of the insulating layers and connect conductor layers that adjacent to each other via the each of the insulating layers are formed. The conductor layers 22 are each patterned to have predetermined conductor patterns. As illustrated in FIG. 1, the second build-up part 20 of the present embodiment does not include a core layer.

In the second build-up part 20, the conductor layers 22 are respectively formed on the lower surfaces of the insulating layers 21. The lower surface of an insulating layer 21 that is not covered by a conductor layer 22, and the conductor layer 22, are covered by a lower insulating layer 21. The uppermost insulating layer 21 that forms the first surface (20F) of the second build-up part 20 covers the conductor layer 112 and the lower surface of the insulating layer 111 of the first build-up part 10 that is not covered by the conductor layer 112.

As illustrated in FIG. 1, in the wiring substrate 1, the second build-up part 20 may be laminated on the third build-up part 30. The second surface (20B) of the second build-up part 20, which is formed by the lower surface of the lowermost insulating layer 21 of the second build-up part 20, faces a first surface (30F) of the third build-up part 30. The third build-up part 30 includes an insulating layer 211 and a conductor layer 212 formed on a lower surface of the insulating layer 211. The insulating layer 211 covers a lowermost conductor layer 221 of the second build-up part 20 and the lower surface of the lowermost insulating layer 21 of the second build-up part 20 that is not covered by the conductor layer 221. In the insulating layer 211, via conductors 33 that penetrate the insulating layer 211 and connect the conductor layer 212 and the conductor layer 221 of the second build-up part 20 are formed.

The insulating layers 21 of the second build-up part 20 can be formed using the same insulating resin as the insulating layers 11. The insulating layers (11, 21) in the build-up parts may contain the same insulating resin or insulating resins different from each other. The insulating layers 21 may each contain a core material (reinforcing material) formed of a glass fiber or an aramid fiber. The insulating layer 211 of the third build-up part 30 contains a core material (21*b*) formed of a glass fiber. The insulating layers (21, 211) may each contain an inorganic filler (not illustrated in the drawings) formed of fine particles of silica ($SiO_2$), alumina, mullite, or the like.

Similar to the conductor layers 12 and the via conductors 13, the conductor layers 22 of the second build-up part 20 and the conductor layer 212 of the third build-up part 30, as well as the via conductors (23, 33), can be formed using any metal such as copper or nickel. As illustrated in FIG. 1, similar to the via conductors 13 in the first build-up part 10, the via conductors 23 included in the second build-up part 20 and the via conductors 33 included in the third build-up part 30 are formed to each have a tapered shape that is reduced in diameter from the second surface (1B) side toward the first surface (1F) side of the wiring substrate 1.

As described above, the wirings included in the conductor layers 22 of the second build-up part 20 and the conductor layer 212 of the third build-up part 30 have larger pattern widths and inter-pattern distances than the wirings included in the conductor layers 12 of the first build-up part 10. The conductor layers 22 are formed thicker than the conductor layers 12, and each have a thickness of, for example, about 10 μm or more. The conductor layers 22 of the second build-up part 20 do not include wiring patterns that are arranged at a fine pitch about the same as that of the fine wirings (FW) of the first build-up part 10. For example, the wirings included in the conductor layers 22 have a minimum wiring width of about 4 μm and a minimum inter-wiring distance of about 6 μm. A via diameter of each via conductor 23 (the diameter of the via conductor 23 at the upper surface of the lower conductor layer 22 to which the via conductor 23 is connected) is about 50 μm.

In the wiring substrate 1 of the present embodiment, for example, as illustrated in the example of FIG. 1, the insulating layer 211 and the conductor layer 212 of the third build-up part 30 are both formed thicker than the insulating layers 21 and the conductor layers 22 in the second build-up part 20. For example, the insulating layer 211 has a thickness of about 100 μm or more and 200 μm or less. Further, the conductor layer 212 has a thickness of about 20 μm. A via diameter of each of the via conductors 33 formed in the insulating layer 211 (a diameter of each of the via conductors 33 on the upper surface of the conductor layer 212) is about 100 μm.

Similar to the conductor layers 12 and the via conductors 13, the conductor layers (22, 212) and the via conductors (23, 33) may be formed to each have a multilayer structure, for example, can each have a two-layer structure including a metal film layer (preferably a sputtering film layer or an electroless plating film layer) and a plating film layer (preferably an electrolytic plating film layer). The second build-up part 20 and the third build-up part 30 do not include fine wiring patterns such as the fine wirings (FW) of the first build-up part 10. In such a case, of the two-layer structure of each of the conductor layers 22 and the via conductors 23 and the conductor layer 212 and the via conductors 33, the metal film layer can be an electroless plating film layer formed by an electroless plating film, in particular, an electroless copper plating film layer, and the plating film layer can be an electrolytic plating film layer formed by an electrolytic plating film, in particular, an electrolytic copper plating film layer.

In the example of FIG. 1, the wiring substrate 1 further includes a solder resist layer 31 formed on the surfaces of the insulating layer 211 and the conductor layer 212. The solder resist layer 31 is formed using, for example, a photosensitive polyimide resin or epoxy resin. Openings (31*a*) are formed in the solder resist layer 31, and conductor pads (32*p*) of the conductor layer 212 of the third build-up part 30 are exposed from the openings (31*a*).

The second surface (1B) of the wiring substrate 1 on the opposite side with respect to the component mounting surface of the wiring substrate 1 can be a connection surface that is to be connected to an external element such as an external wiring substrate (for example, a motherboard of any electrical device) when the wiring substrate 1 itself is mounted on the external element. The conductor pads (32*p*) can be connected to any substrate, electrical component, mechanism component, or the like.

Next, with reference to FIGS. 3A-3S, a method for manufacturing the wiring substrate of the embodiment is described using a case where the wiring substrate 1 illustrated in FIG. 1 is manufactured as an example. Structural elements formed in the manufacturing method to be described below can be formed using the materials exemplified as the materials of the corresponding structural elements in the description of the wiring substrate 1 in FIG. 1, unless otherwise specified. In the following description about the manufacture of the wiring structure 1, a side closer to a support substrate (GS) is referred to as “lower” or a “lower side,” and a side farther from the support substrate (GS) is referred to as “upper” or an “upper side.” Therefore, of each of the elements of the wiring structure 1, a surface facing the support substrate (GS) is referred to as a “lower surface,” and a surface facing the opposite side with respect to the support substrate (GS) is also referred to as an “upper surface.”

The wiring substrate 1 may be formed by manufacturing the first build-up part 10 on the support substrate (GS) and manufacturing the second build-up part 20 on the first build-up part 10 and the third build-up part 30 on the second build-up part 20 (see FIG. 1). In this way, by first manufacturing the first build-up part 10 on the support substrate (GS) and removing the support substrate (GS) after the second build-up part 20 and the third build-up part 30 are formed on the first build-up part 10, it is thought that a yield in manufacturing the wiring substrate 1 can be improved. Further, according to the manufacturing method of the embodiment, since the component mounting surface of the wiring substrate 1 is an exposed surface after the support substrate (GS) is removed, it is thought that a wiring substrate 1 having a highly flat component mounting surface can be obtained. For example, the wiring substrate 1 of the embodiment can be formed such that a height difference of the component mounting surface in the thickness direction is about ±10 μm.

First, as illustrated in FIG. 3A, the support substrate (GS) having good surface flatness, such as a glass substrate, is prepared. On both sides of the support substrate (GS), a metal film layer 121 is formed via an adhesive layer (AL) containing, for example, an azobenzene-based polymer adhesive that can be attached or detached by irradiation with light. The metal film layer 121 is, for example, a metal film (preferably copper film) layer formed by electroless plating or sputtering or the like. It is also possible that the metal film layer 121 is formed of a relatively thin metal foil.

Next, as illustrated in FIG. 3B, a conductor layer 12 that has multiple conductor pads (12*p*) and includes the metal film layer 121 and the plating film layer 122 is formed via the adhesive layer (AL) on the support substrate (GS).

In forming the conductor layer 12, for example, a plating resist is formed on the metal film layer 121, and openings are formed in the plating resist according to formation regions of patterns of the conductor pads (12*p*), for example, by photolithography. Next, the plating film layer 122 is formed in the openings by electrolytic plating using the metal film layer 121 as a seed layer. After the formation of the plating film layer 122, the plating resist is removed, and the metal film layer 121 exposed by the removal of the plating resist is etched and the state illustrated in FIG. 3B is formed.

Next, as illustrated in FIG. 3C, an insulating layer 11 covering the conductor layer 12 is laminated. The insulating layer 11 is formed of a resin material containing the inorganic particles 16 (not illustrated in FIG. 3C, see FIG. 3D) formed of, for example, silica ($SiO_2$), alumina, mullite, or the like, and the insulating resin 15 formed of, for example, an epoxy resin, a phenol resin, or the like. The insulating layer 11 is formed by thermocompression bonding the resin material molded into a film-like shape. The protective film 17 formed of a polyethylene terephthalate (PET) film or the like is laminated on the insulating layer 11. A release agent (not illustrated) or the like for allowing the protective film 17 to be easily peeled off may be formed between the protective film 17 and the insulating layer 11.

In FIG. 3C, and FIGS. 3D-3S to be referenced below, the laminate formed on the surface on one side of the support substrate (GS) is illustrated, and illustration of the laminate that can be formed on the surface on the opposite side is omitted. However, on the surface on the opposite side, conductor layers and insulating layers may be formed in the same manner and number as those on the surface on the one side or in different manner and number from those on the surface on the one side, or it is also possible that such conductor layers and insulating layers are not formed.

The following FIGS. 3D-3H are enlarged views of a portion (III) of the wiring substrate 1, which is being manufactured and is illustrated in FIG. 3C and illustrate the method for manufacturing wiring substrate. FIG. 3D illustrates a state in which the insulating layer 11 covering the conductor layer 12 and the protective film 17 on the surface of the insulating layer 11 are laminated in the process illustrated in FIG. 3C, that is, in the wiring substrate 1 being manufactured.

Next, as illustrated in FIG. 3E, a through hole (11*a*) is formed at a formation position of a via conductor 13 (see FIG. 1) in the insulating layer 11, for example, by irradiation with $CO_2$ laser, excimer laser, or the like. Irradiation with laser such as $CO_2$ laser is performed while the surface of the insulating layer 11 is protected by being covered with a protective film 17 such as a polyethylene terephthalate (PET) film. The through hole (11*a*) penetrating the protective film 17 and the insulating layer 11 is formed. Since the surface (11B) of the insulating layer 11 is covered with the protective film 17 when the through hole (11*a*) is formed, even when resin is scattered during the formation of the through hole (11*a*) with laser, adherence of the resin to the surface (11B) of the insulating layer 11 can be suppressed. The inner wall surface (11*s*) of each of the through holes (11*a*) is formed of the insulating resin 15 and the inorganic particles 16 protruding from the insulating resin 15.

Figure 3F:
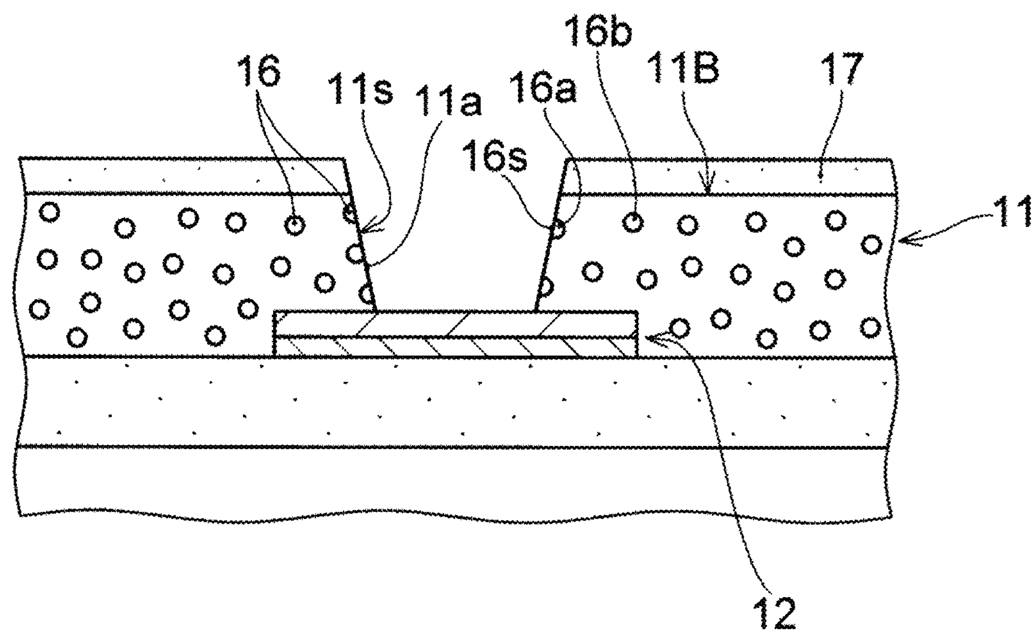
FIG. 3F is an enlarged view illustrating an example of a method for manufacturing a wiring substrate according to an embodiment of the present invention.
Figure 3G:
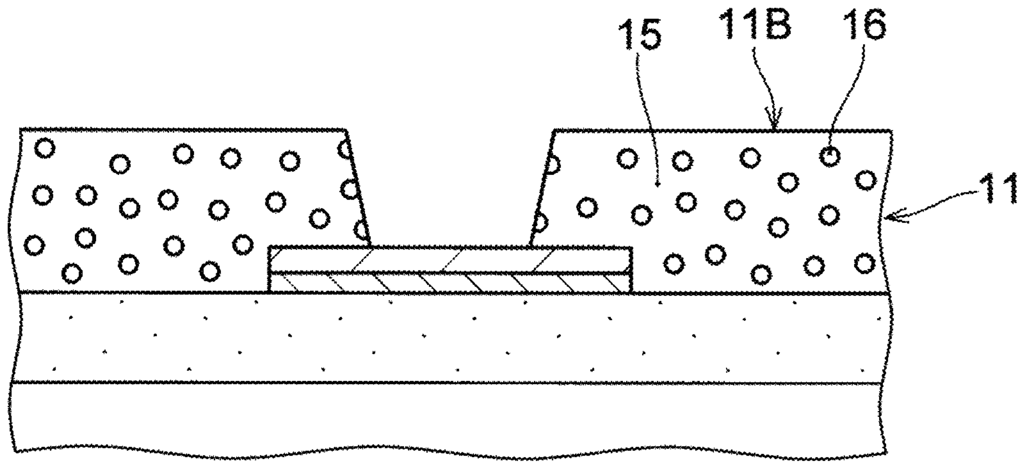
FIG. 3G is an enlarged view illustrating an example of a method for manufacturing a wiring substrate according to an embodiment of the present invention.

Next, as illustrated in FIG. 3F, a desmear treatment is performed. The desmear treatment is preferably a dry desmear treatment using a plasma gas. The desmear treatment is also performed while the surface (11B) of the insulating layer 11 is protected with the protective film 17 having been formed on the surface of the insulating layer 11.

By the desmear treatment, the protruding portions of the inorganic particles 16 protruding from the insulating resin 15 on the inner wall surface (11*s*) of each of the through holes (11*a*) can be selectively removed. The inorganic particles 16 (the substantially spherical second inorganic particles (16*b*)) are cut along a plane, and the first inorganic particles (16*a*) having the flat parts (16*s*) are formed. The inner wall surface (11*s*) of each of the through holes (11*a*) is formed of exposed surfaces of flat parts (16*s*) of the first inorganic particles (16*a*) and the insulating resin 15. The desmear treatment can also prevent a decrease in adhesion or an increase in a resistance component or the like during the formation of the conductor layer 12 due to a processing-modified substance generated at bottoms of the through holes 11 after formation.

Next, as illustrated in FIG. 3F, the protective film 17 is removed from the insulating layer 11. The surface (11B) of the insulating layer 11 is exposed. As described above, the surface (11B) of the insulating layer 11 is not affected by the laser or the desmear treatment, and thus, is flat. The surface (11B) of the insulating layer 11 is formed only of the insulating resin 15. The inorganic particles 16 are not exposed on the surface (11B) of the insulating layer 11.

Figure 3H:
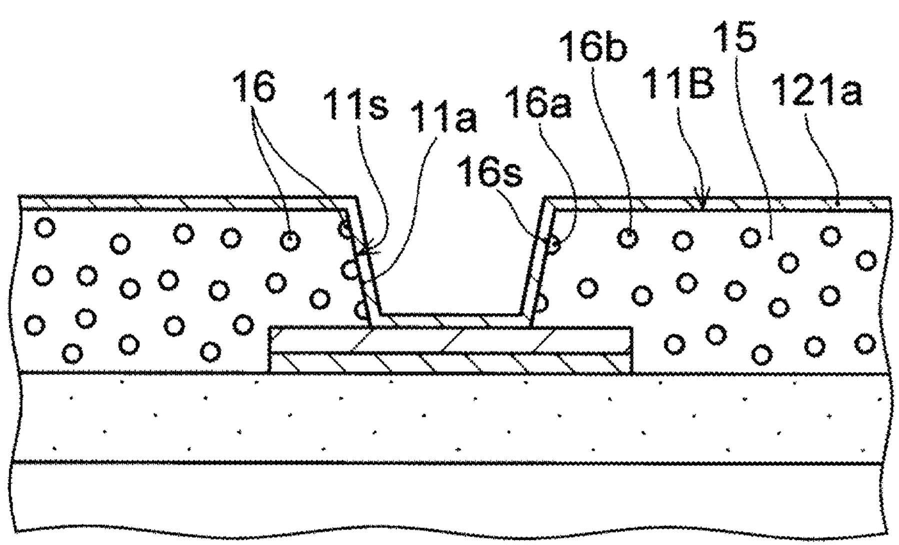
FIG. 3H is an enlarged view illustrating an example of a method for manufacturing a wiring substrate according to an embodiment of the present invention.
Figure 3I:
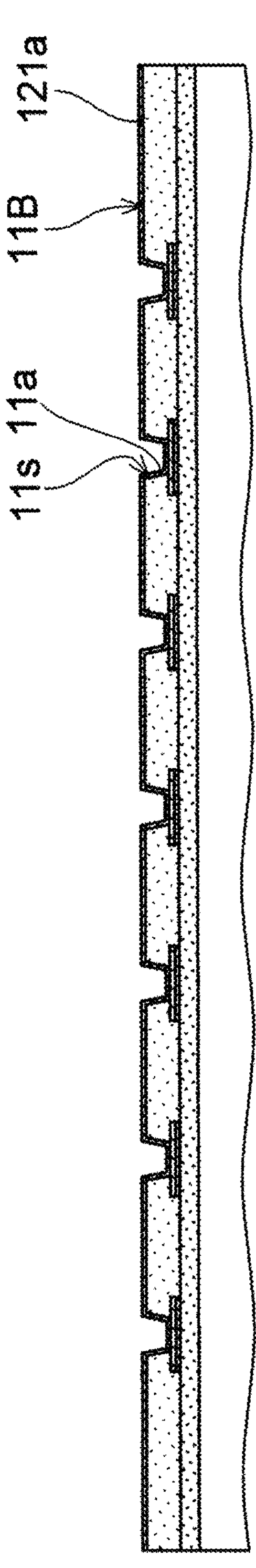
FIG. 3I illustrates an example of a method for manufacturing a wiring substrate according to an embodiment of the present invention.

Next, as illustrated in FIG. 3H, a metal film (seed layer) (121*a*) forming a first layer 121 (see FIG. 3M) of a conductor layer 12 is formed on surfaces in the through holes (11*a*) and on the surface (11B) of the insulating layer 11 by electroless plating or sputtering or the like. Preferably, the metal film (121*a*) can be a sputtering film formed by sputtering. The metal film (121*a*) covers the smooth inner wall surface (11*s*), which is formed of the exposed surfaces of the flat parts (16*s*) of the first inorganic particles (16*a*) and the insulating resin 15. FIG. 3I illustrates an overall view of the wiring substrate 1 being manufactured in the process illustrated in FIG. 3H (however, illustration of the laminate that can be formed on the opposite side of the support substrate (GS) and illustration of the inorganic particles 16 are omitted).

Figure 3J:
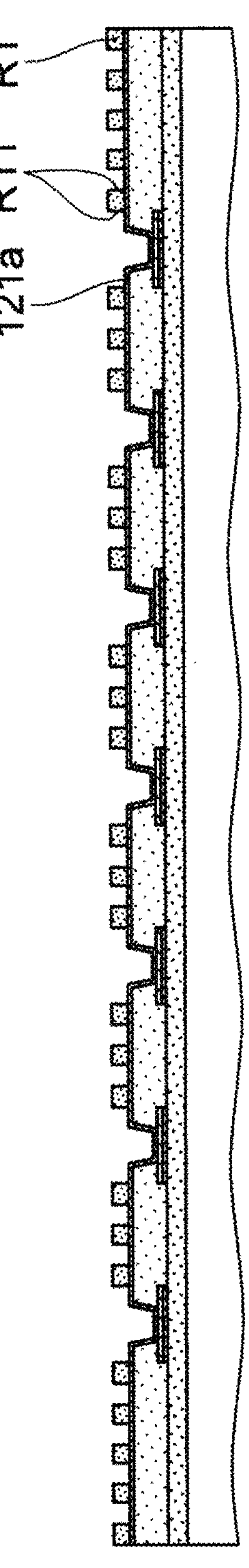
FIG. 3J illustrates an example of the method for manufacturing a method for manufacturing a wiring substrate according to an embodiment of the present invention.

Next, in order to form the second layer 122 of the conductor layer 12, as illustrated in FIG. 3J, on the formed metal film (121*a*), a plating resist (R1) having openings (R11) corresponding to the conductor patterns to be included in the conductor layer 12 is provided, for example by lamination of a dry film resist and exposure and development or the like.

Figure 3K:
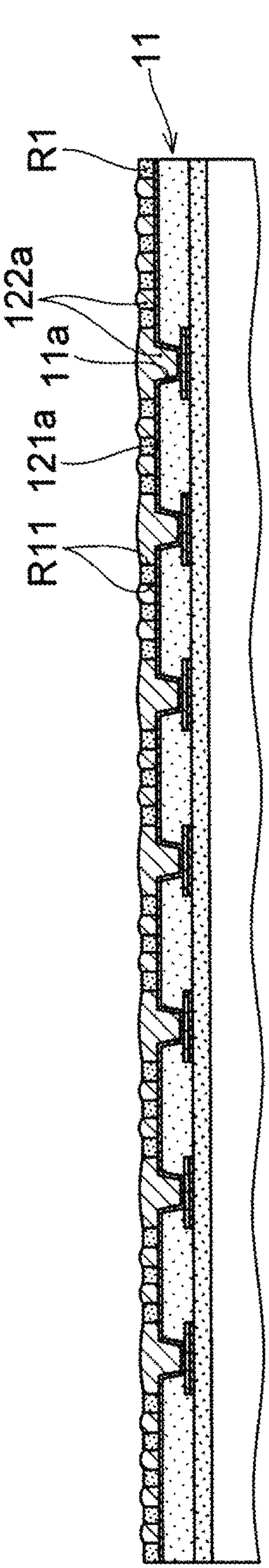
FIG. 3K illustrates an example of a method for manufacturing a wiring substrate according to an embodiment of the present invention.

As illustrated in FIG. 3K, an electrolytic plating film (122*a*) is formed with a height higher than that of the plating resist (R1) in the openings (R11) of the plating resist (R1) by electrolytic plating using the metal film (121*a*) as a power feeding layer. The electrolytic plating film (122*a*) can be formed to have a height higher than that of the openings (R11) and is formed, for example, to have a convex spherical surface that protrudes upward. For example, the electrolytic plating film (122*a*) filled in the openings (R11) can be formed thicker than the plating resist (R1) by 1 μm or more. The electrolytic plating film (122*a*) completely fills the through holes (11*a*) of the insulating layer 11. As a result, the via conductors 13 are integrally formed with the conductor layer 12.

Figure 3L:
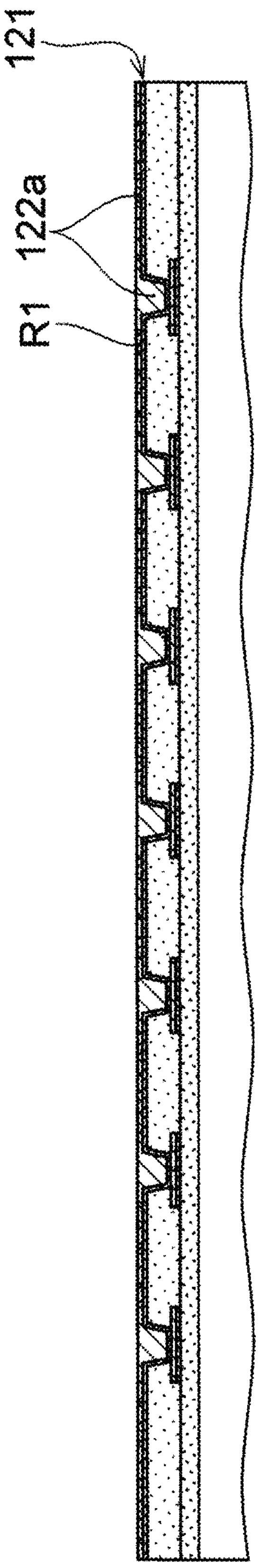
FIG. 3L illustrates an example of a method for manufacturing a wiring substrate according to an embodiment of the present invention.

Next, as illustrated in FIG. 3L, a part of the electrolytic plating film (122*a*) in the thickness direction is removed by polishing. For example, a part of the electrolytic plating film (122*a*) is removed by chemical mechanical polishing (CMP) or sandblasting. By the polishing, a part of the plating resist (R1) in the thickness direction is also removed. Specifically, the electrolytic plating film (122*a*) is polished together with the plating resist (R1) until a predetermined thickness required for the second layer 122 of the conductor layer 12 is reached. It is thought that the thickness of the second layer 122 can be easily adjusted. For example, the conductor layer 21 can have a thickness of about 7 μm or less. Then, the second layer 122 of the two-layer structure of the conductor layer 12 can be formed to have a thickness of, for example, about 6.5 μm or less.

In this way, by adjusting the thickness of the electrolytic plating film (122*a*) by polishing, after the electrolytic plating film (122*a*) is formed, for example, as illustrated in FIG. 3K, even when the surface has unevenness, the surface of the second layer 122 (the upper surface of the second layer 122 illustrated in FIG. 3M) of the conductor layer 12 that has been subjected to polishing is flattened. That is, the surface (lower surface) of each of the conductor layers 12 in the first build-up part 10 of the wiring substrate 1 is a highly flat polished surface. When the surface (lower surface) of each of the conductor layers 12 is such a polished surface with less unevenness, it may be possible that good high-frequency transmission characteristics can be obtained in the first build-up part 10. It is thought that a problem such as misalignment during the formation of the via conductors 13 connecting the conductor layers 12 is also unlikely to occur. Further, since the entire surface (lower surface) of each of the conductor layers 12 is polished, the conductor layers 12 in the first build-up part 10 can each be formed with high flatness without undulation or the like regardless of the density of the conductor patterns in the conductor layers 12. It is thought that the flatness of the first build-up part 10 is improved and a high quality wiring substrate 1 is obtained.

Figure 3M:
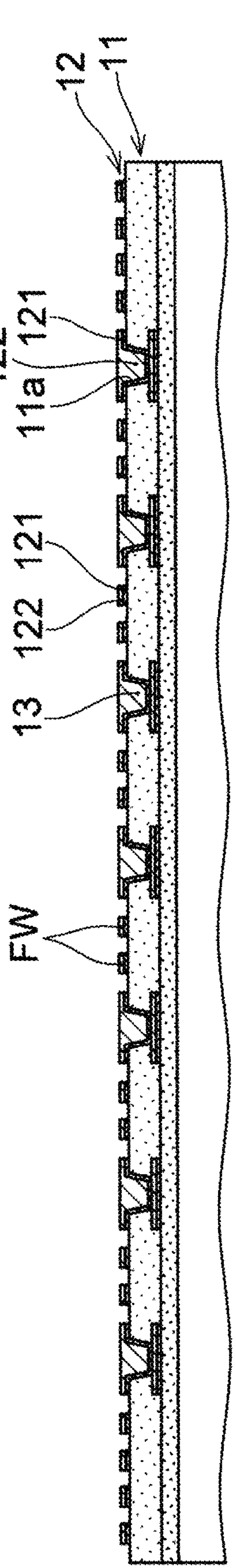
FIG. 3M illustrates an example of a method for manufacturing a wiring substrate according to an embodiment of the present invention.

Next, as illustrated in FIG. 3M, the plating resist (R1) is removed. After that, a portion of the metal film (121*a*) that is not covered by the electrolytic plating film (122*a*) is removed by etching or the like. As a result, a conductor layer 12 that includes the fine wirings (FW) and has a two-layer structure including the first layer 121 and the second layer 122 is formed. Further, the via conductors 13 are formed by completely filling the through holes (11*a*) with the electrolytic plating film (122*a*).

Figure 3N:
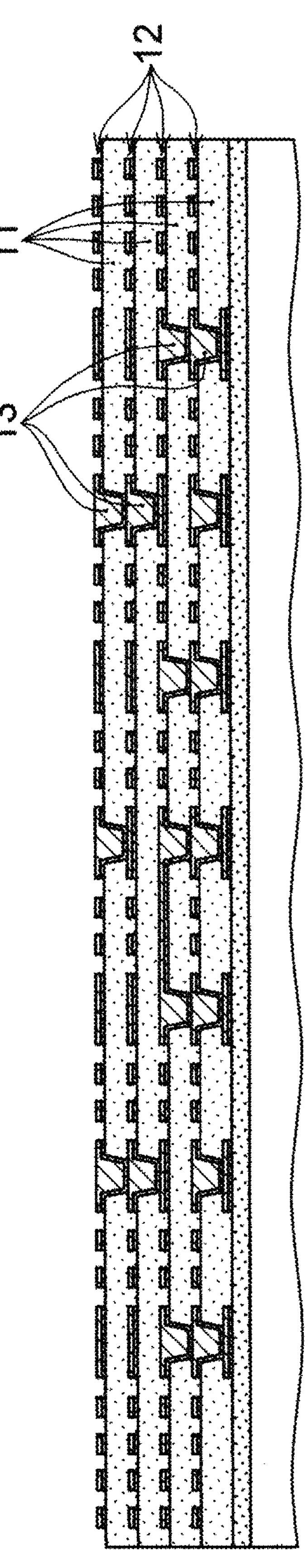
FIG. 3N illustrates an example of a method for manufacturing a wiring substrate according to an embodiment of the present invention.

Subsequently, as illustrated in FIG. 3N, using the same methods as the methods for forming the insulating layer 11, the conductor layer 12 and the via conductors 13 described above, on the conductor layer 12 and the insulating layer 11, a desired number of insulating layers 11 and conductor layers 12, and via conductors 13 penetrating the respective insulating layers, are formed.

Figure 3O:
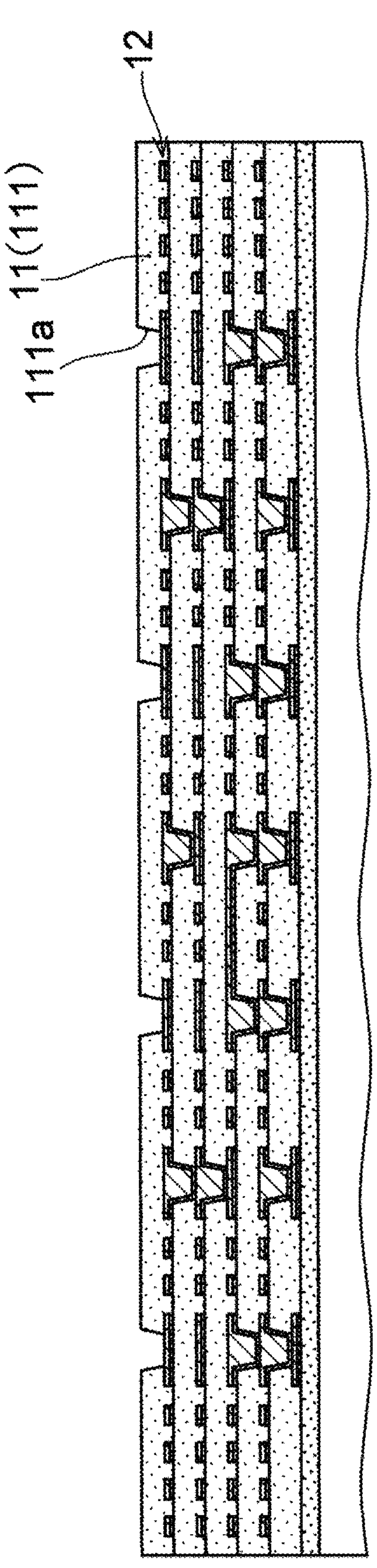
FIG. 3O illustrates an example of a method for manufacturing a wiring substrate according to an embodiment of the present invention.

Next, as illustrated in FIG. 3O, on the upper side of the conductor layer 12, the insulating layer 111, which is the outermost layer among the insulating layers 11 of the first build-up part 10, is formed. After that, the through holes (111*a*) for forming the via conductors 113 are formed by laser processing in the insulating layer 111 at positions corresponding to formation locations of the via conductors 113 (see FIG. 1).

Figure 3P:
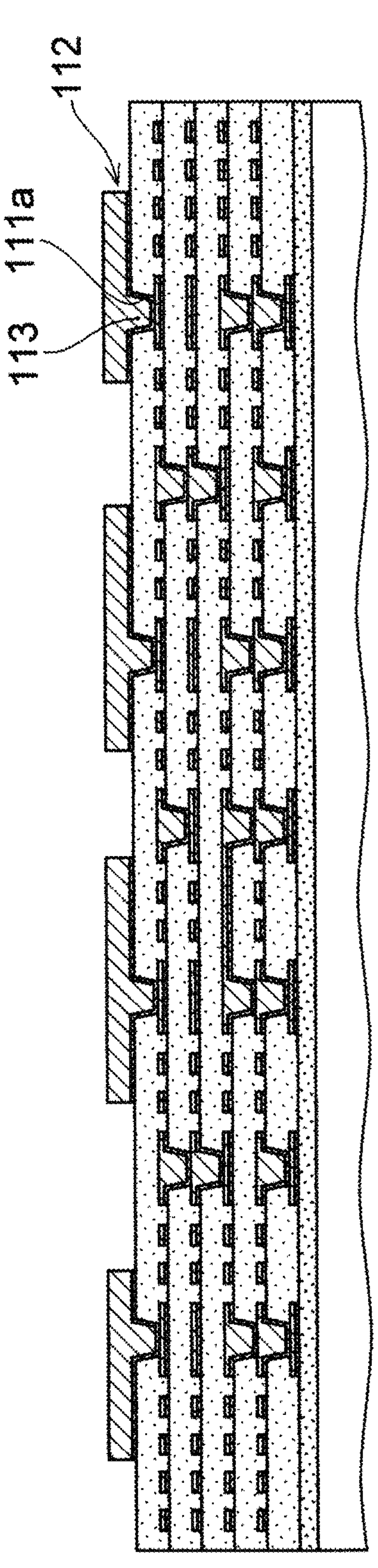
FIG. 3P illustrates an example of a method for manufacturing a wiring substrate according to an embodiment of the present invention.
Figure 3Q:
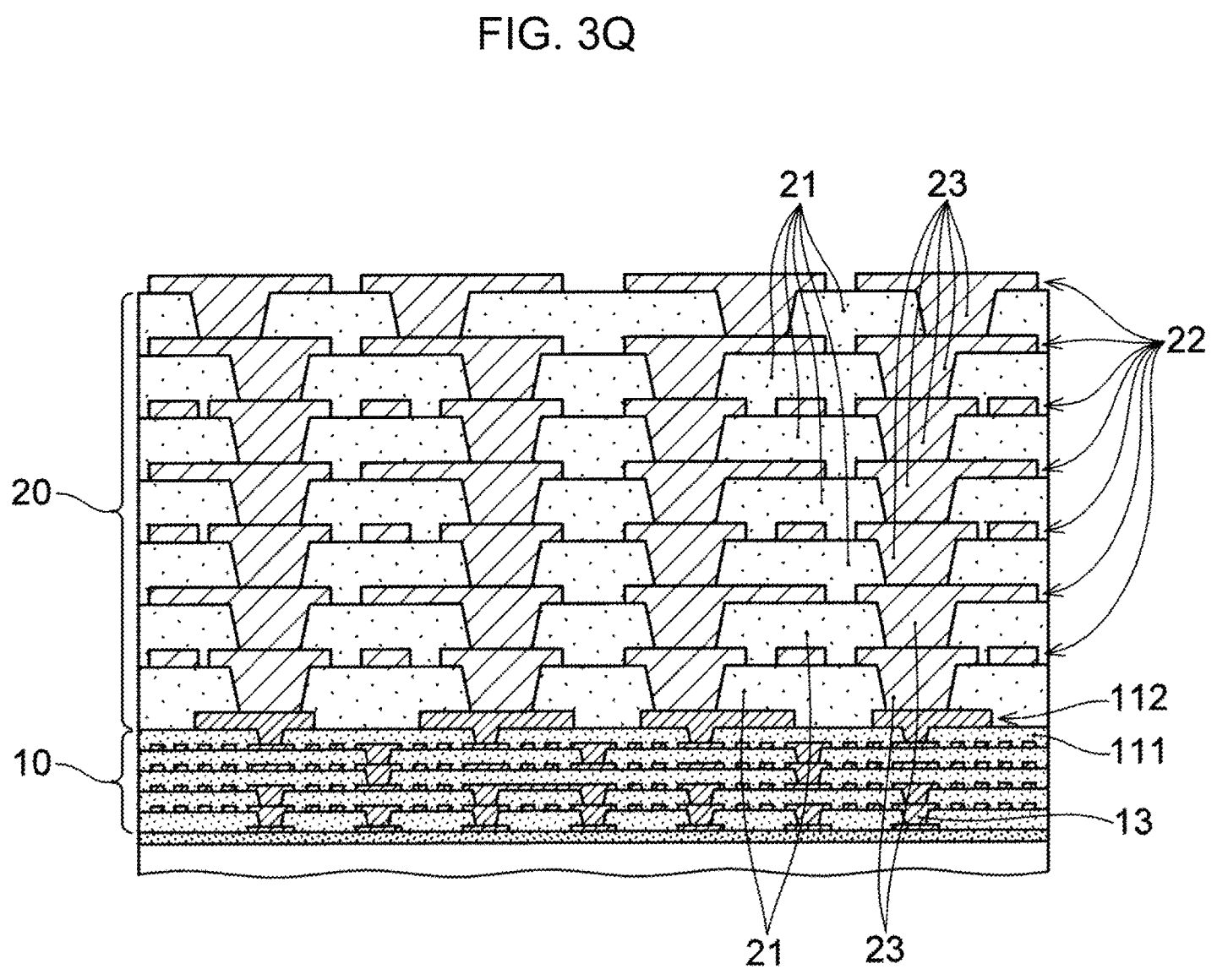

Subsequently, as illustrated in FIG. 3P, at the same time as the via conductors 113 filling the through holes (111*a*) are formed, the conductor layer 112 is formed using any method for forming conductor patterns, such as a semi-additive method.

Subsequently, as illustrated in FIG. 3Q, using the same methods as the methods for forming the insulating layer 111, the conductor layer 112 and the via conductors 113 described above, on the conductor layer 112 and the insulating layer 111, a desired number of insulating layers 21 and conductor layers 22, and via conductors 23 penetrating the respective insulating layers, are formed. The second build-up part 20 is formed on the first build-up part 10.

Figure 3R:
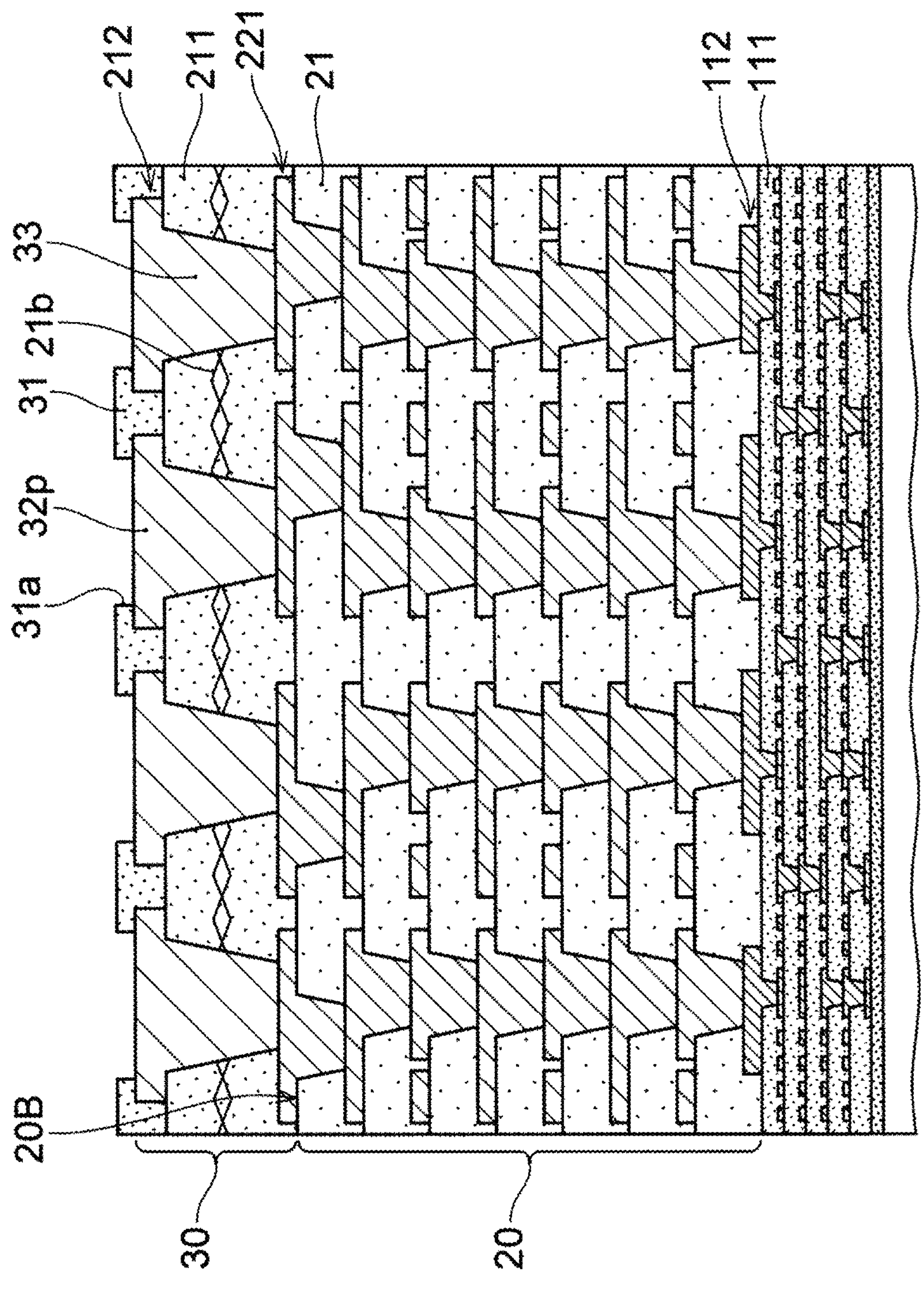
FIG. 3R illustrates an example of a method for manufacturing a wiring substrate according to an embodiment of the present invention.
Figure 3S:
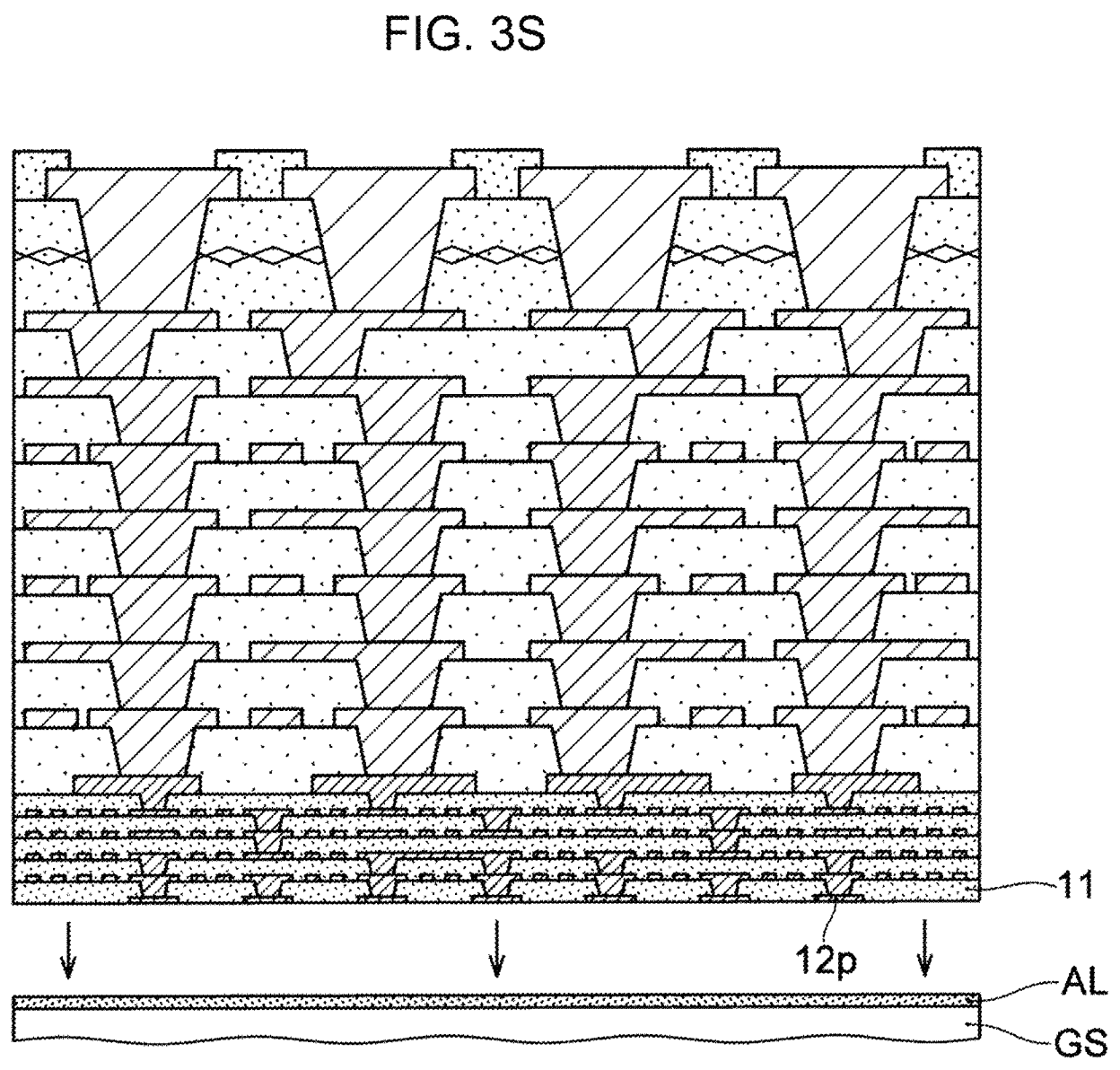

As illustrated in FIG. 3R, on the outermost insulating layer 21 and the outermost conductor layer 22 (conductor layer 221) on the second surface (20B) side of the second build-up part 20, the insulating layer 211, the conductor layer 212 and the via conductors 33 penetrating the insulating layer 211 of the third build-up part 30 are formed using the same methods as the methods for forming the insulating layer 111, the conductor layer 112 and the via conductors 113. As an insulating resin forming the insulating layer 211, a prepreg containing an insulating resin such as an epoxy resin or a BT resin impregnated in a reinforcing material (core material) (21*b*) formed of a glass fiber is used.

Next, the solder resist layer 31 is formed by forming a photosensitive epoxy resin or polyimide resin layer on the surfaces of the insulating layer 211 and the conductor layer 212. Then, using a photolithography technology, the openings (31*a*) that respectively define the conductor pads (32*p*) are formed.

Next, as illustrated in FIG. 3S, the support substrate (GS) is removed. The lower surfaces of the conductor pads (12*p*) and the lower surface of the insulating layer 11 are exposed. In removing the support substrate (GS), the adhesive layer (AL) is irradiated with, for example, laser and is softened, and then the support substrate (GS) is peeled off from the conductor pads (12*p*) and the insulating layer 11. The adhesive layer (AL) that can remain on the surfaces of the conductor pads (12*p*) and the insulating layer 11 can be removed by washing. The wiring substrate 1 illustrated in FIG. 1 is completed.

The wiring substrate of the embodiment is not limited to those having the structures illustrated in the drawings and those having the structures, shapes, and materials exemplified in the present specification. As described above, the build-up parts included in the wiring substrate of the embodiment can each have any number of insulating layers and conductor layers. For example, it is also possible that the outermost insulating layer and conductor layer on the opposite side with respect to the component mounting surface of the wiring substrate are not respectively formed thicker than the insulating layers 21 and the conductor layers 22 in the second build-up part, and it is also possible that the outermost insulating layer on the opposite side with respect to the component mounting surface of the wiring substrate does not include a core material. Further, the method for manufacturing the wiring substrate of the embodiment is not limited to the method described with reference to FIGS. 3A-3S, and the conditions, processing order, and the like of the method can be arbitrarily modified. Further, it is also possible that a specific process is omitted or another process is added. For example, a plating layer including a nickel layer and a tin layer may be formed on the surfaces of the conductor pads (12*p*) exposed after the support substrate (GS) is removed.

Japanese Patent Application Laid-Open Publication No. 2015-126103 describes a printed wiring board that includes an insulating layer having a through hole. The insulating layer contains insulating particles, and, in the through hole, an interlayer connection structure is formed that connects a first conductor layer and a second conductor layer, which are formed with the insulating layer sandwiched therebetween.

In the printed wiring board described in Japanese Patent Application Laid-Open Publication No. 2015-126103, the interlayer connection structure includes a composite layer, which is formed on an inner peripheral surface of the through hole and contains inorganic particles, and a metal filling an inner side of the composite layer. There is a risk that a thickness of the composite layer may become non-uniform.

A wiring substrate according to an embodiment of the present invention has a first surface and a second surface on the opposite side with respect to the first surface, and includes a first build-up part and a second build-up part, which each include: alternately laminated multiple insulating layers and multiple conductor layers; and via conductors that are formed in through holes provided in the insulating layers and connect the conductor layers separated by the insulating layers. The first build-up part is laminated on the second build-up part and is positioned closer to the first surface side than the second build-up part is. A wiring width and an inter-wiring distance of wirings in a first conductor layer included in the first build-up part are respectively smaller than a wiring width and an inter-wiring distance of wirings in a second conductor layer included in the second build-up part. A first insulating layer included in the first build-up part contains inorganic particles and an insulating resin. The inorganic particles include first inorganic particles forming an inner wall surface of each of the through holes in the first build-up part and second inorganic particles embedded in the first insulating layer. Shapes of the first inorganic particles are different from shapes of the second inorganic particles. The first conductor layer and first via conductors included in the first build-up part are each formed of a metal film layer formed on a surface of the first insulating layer and a plating film layer formed on a surface of the metal film layer on the opposite side with respect to the first insulating layer side.

According to an embodiment of the present invention, a wiring substrate with high connection reliability can be provided in which via conductors including a seed layer with a uniform thickness are formed in through holes of an insulating layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising a first build-up part comprising a plurality of first insulating layers and a plurality of first conductor layers such that the plurality of first insulating layers includes an outermost first insulating layer;

a second build-up part laminated to the outermost first insulating layer of the first build-up part and comprising a plurality of second insulating layers and a plurality of second conductor layers such that the first build-up part is positioned closer to a first surface side of the wiring substrate than the second build-up part; and a plurality of via conductors comprising a plurality of first via conductors formed in the first insulating layers in the first build-up part and a plurality of second via conductors formed in the second insulating layers in the second build-up part such that the first via conductors are connecting the first conductor layers in the first build-up part and that the second via conductors are connecting the second conductor layers in the second build-up part, wherein the first build-up part is formed such that the plurality of first conductor layers includes a first conductor layer formed on the outermost first insulating layer on the first surface side of the wiring substrate and having a flat polished surface, that the plurality of first via conductors includes an outermost first via conductor formed in the outermost first insulating layer and comprising a sputtering film layer formed on the flat polished surface of the first conductor layer formed on the outermost first insulating layer, that the first conductor layers include a plurality of wirings having a wiring width and an inter-wiring distance that are smaller than a wiring width and an inter-wiring distance of wirings in the second conductor layers in the second build-up part respectively, that the first insulating layers include insulating resin and inorganic particles including first inorganic particles forming inner wall surfaces in through holes for the first via conductors and second inorganic particles embedded in the first insulating layers having shapes that are different from shapes of the first inorganic particles, and that each of the first conductor layers and first via conductors includes a metal film layer formed on a surface of a respective one of the first insulating layers and a plating film layer formed on a surface of the metal film layer.

2. The wiring substrate according to claim 1, wherein the first build-up part is formed such that a minimum wiring width of the wirings in the first conductor layers is 3 μm or less and that a minimum inter-wiring distance of the wirings in the first conductor layers is 3 μm or less.

3. The wiring substrate according to claim 2, wherein the first build-up part is formed such that an aspect ratio of the wirings in the first conductor layers is in a range of 2.0 to 4.0.

4. The wiring substrate according to claim 2, wherein the first build-up part is formed such that the first conductor layers have polished surfaces on a second surface side of the wiring substrate on an opposite side with respect to the first surface side.

5. The wiring substrate according to claim 2, further comprising:

a third build-up part formed on the second build-up part on a second surface side of the wiring substrate on an opposite side with respect to the first surface side and comprising a third insulating layer and a third conductor layer, wherein the plurality of via conductors includes a plurality of third via conductors formed in the third insulating layer such that the third via conductors are connecting the third conductor layer and one of the second conductor layers in the second build-up part across the third insulating layer.

6. The wiring substrate according to claim 5, wherein the third build-up part is formed such that the third insulating layer includes a core material.

7. The wiring substrate according to claim 1, wherein the first build-up part is formed such that an aspect ratio of the wirings in the first conductor layers is in a range of 2.0 to 4.0.

8. The wiring substrate according to claim 1, wherein the first build-up part is formed such that the first conductor layers have flat polished surfaces on a second surface side of the wiring substrate on an opposite side with respect to the first surface side of the wiring substrate.

9. The wiring substrate according to claim 1, further comprising:

a third build-up part formed on the second build-up part on a second surface side of the wiring substrate on an opposite side with respect to the first surface side and comprising a third insulating layer and a third conductor layer, wherein the plurality of via conductors includes a plurality of third via conductors formed in the third insulating layer such that the third via conductors are connecting the third conductor layer and one of the second conductor layers in the second build-up part across the third insulating layer.

10. The wiring substrate according to claim 9, wherein the third build-up part is formed such that the third insulating layer includes a core material.

11. The wiring substrate according to claim 10, wherein the core material of the third insulating layer includes a glass fiber.

12. The wiring substrate according to claim 1, wherein the first build-up part includes a plurality of conductor pads embedded in one of the first insulating layers such that each of the conductor pads has a surface exposed on a first surface of the wiring substrate and that the plurality of conductor pads is positioned to form a component mounting surface in a component mounting region.

13. The wiring substrate according to claim 1, wherein the first build-up part is formed such that the first inorganic particles in the first insulating layers have flat parts and that the flat parts of the first inorganic particles are forming part of the inner wall surfaces in the through holes.

14. The wiring substrate according to claim 13, wherein the first build-up part is formed such that the inner wall surfaces in the through holes have an arithmetic mean roughness Ra of 1.0 μm or less.

15. The wiring substrate according to claim 13, wherein the first build-up part is formed such that each of the inner wall surfaces in the through holes includes the flat parts of the first inorganic particles and surfaces of the insulating resin.

16. The wiring substrate according to claim 15, wherein the flat parts of the first inorganic particles and the surfaces of the insulating resin form substantially common surfaces of the inner wall surfaces in the through holes.

17. The wiring substrate according to claim 1, wherein the first build-up part is formed such that each of the second inorganic particles in the first insulating layers has a spherical shape.

18. The wiring substrate according to claim 17, wherein the first build-up part is formed such that the first inorganic particles have divided shapes of the second inorganic particles.

19. The wiring substrate according to claim 1, wherein the first build-up part is formed such that each of the first inorganic particles in the first insulating layers has a spherical segment shape.

20. The wiring substrate according to claim 1, wherein the first build-up part is formed such that the metal film layer of each of the first conductor layers and first via conductors includes a sputtering film layer.

* * * * *